United States Patent [19]

Wagner

[11] 4,013,955
[45] Mar. 22, 1977

[54] ANALOG SIGNAL PROCESSOR

[75] Inventor: Peter B. Wagner, Reno, Nev.

[73] Assignee: The United States of America as represented by the Secretary of the Navy, Washington, D.C.

[22] Filed: July 2, 1975

[21] Appl. No.: 592,852

[52] U.S. Cl. .............................. 324/72; 324/115; 328/260; 307/260; 321/9 R; 321/8 R; 321/18; 321/27

[51] Int. Cl.² .................. H02M 7/00; H03K 5/00

[58] Field of Search ............. 328/26; 307/260; 321/9 R, 8 R, 18, 27; 324/115, 72

[56] References Cited

UNITED STATES PATENTS

| | | | |
|---|---|---|---|
| 3,238,383 | 3/1966 | Falk | 307/88.5 |
| 3,305,769 | 2/1967 | Julie | 323/74 |
| 3,480,794 | 11/1969 | Richman | 307/229 |
| 3,491,252 | 1/1970 | Petrohkos | 307/229 |
| 3,539,936 | 11/1970 | McGhee | 330/29 |
| 3,564,387 | 2/1971 | Gadberry | 321/8 |
| 3,586,973 | 6/1971 | Lawton | 324/72 |
| 3,825,816 | 7/1974 | Togneri et al. | 321/18 |

Primary Examiner—R. V. Rolinec
Assistant Examiner—Vincent J. Sunderdick
Attorney, Agent, or Firm—R. S. Sciascia; Charles D. B. Curry

[57] ABSTRACT

An analog signal processor that is particularly suitable for measuring, integrating and holding a single or a pair of analog signals. The input signal to the analog signal processor may be sinusoidal of relatively low frequency and of low signal strength and slowly varying phase such as may be obtained from a pair of capacitive plates used in electric field measuring devices. The analog signal processor includes an analog current to voltage convertor, a synchronous rectifier and an integrate and hold circuit. In practice the analog signal processor may be mounted on a rotating shaft and converts the very low differentially alternating current input to a proportional d.c. voltage output. The analog signal processor includes timing and switching circuits to provide the desired information about vertical, horizontal and inclined electric fields.

6 Claims, 14 Drawing Figures

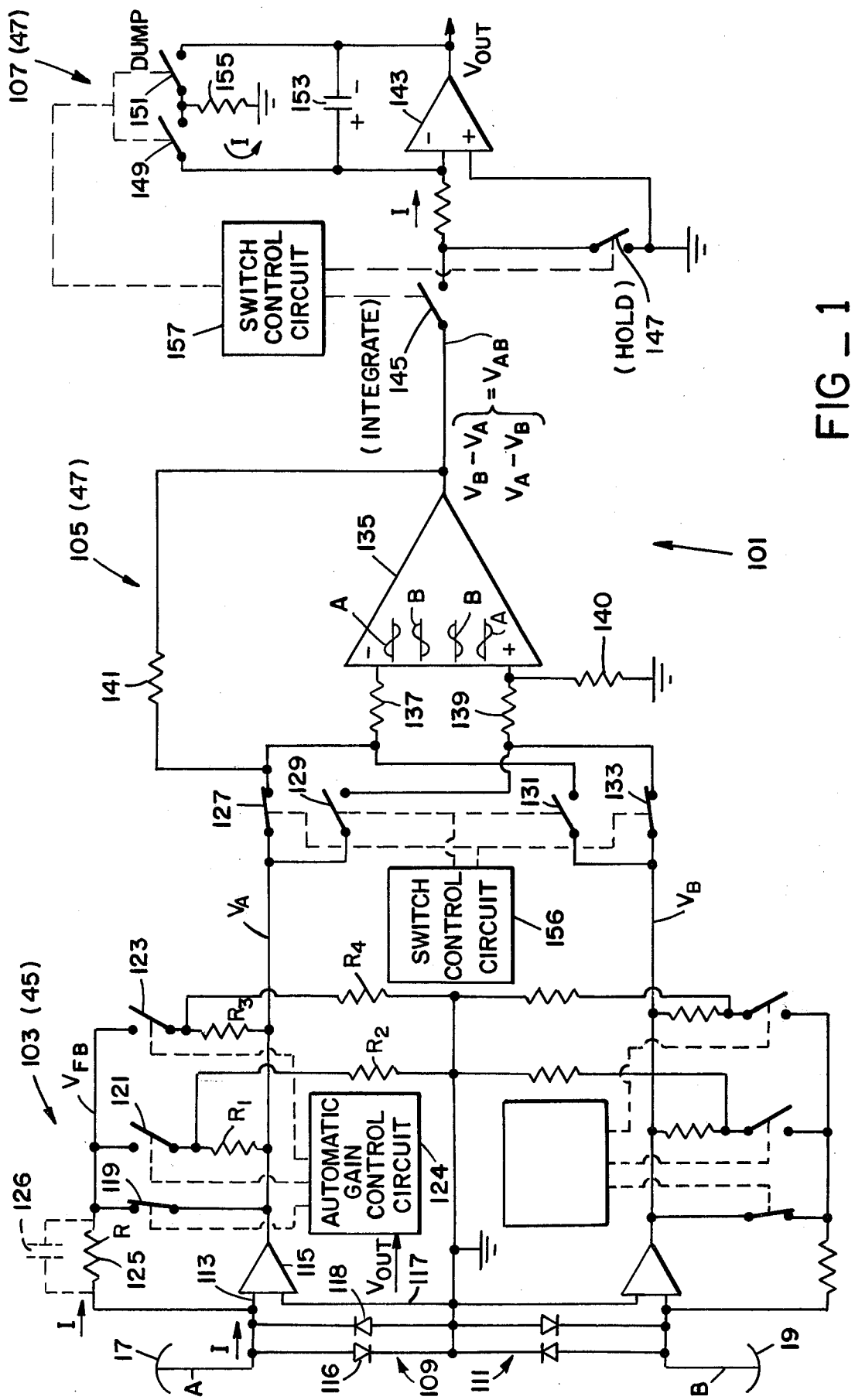
FIG_1

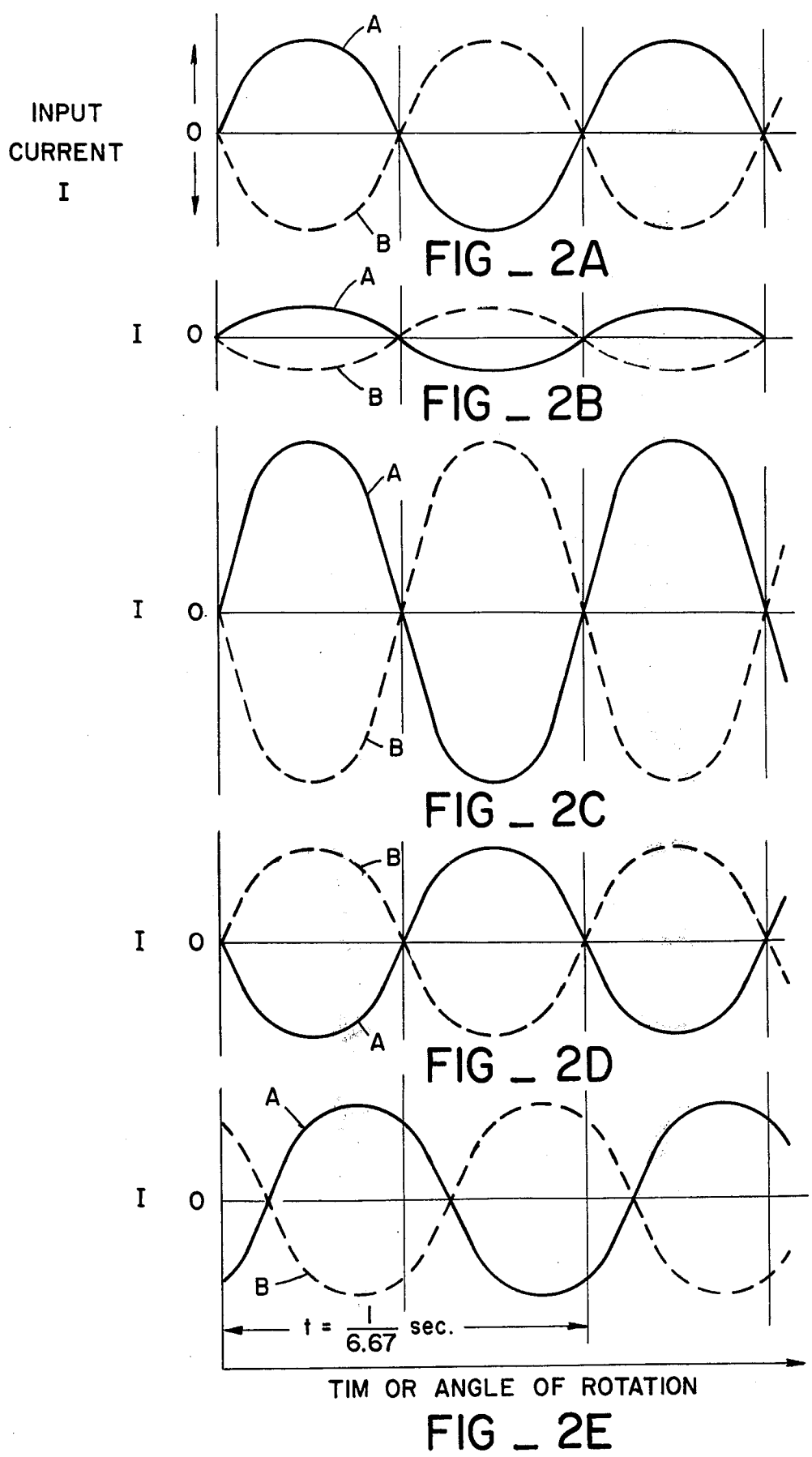

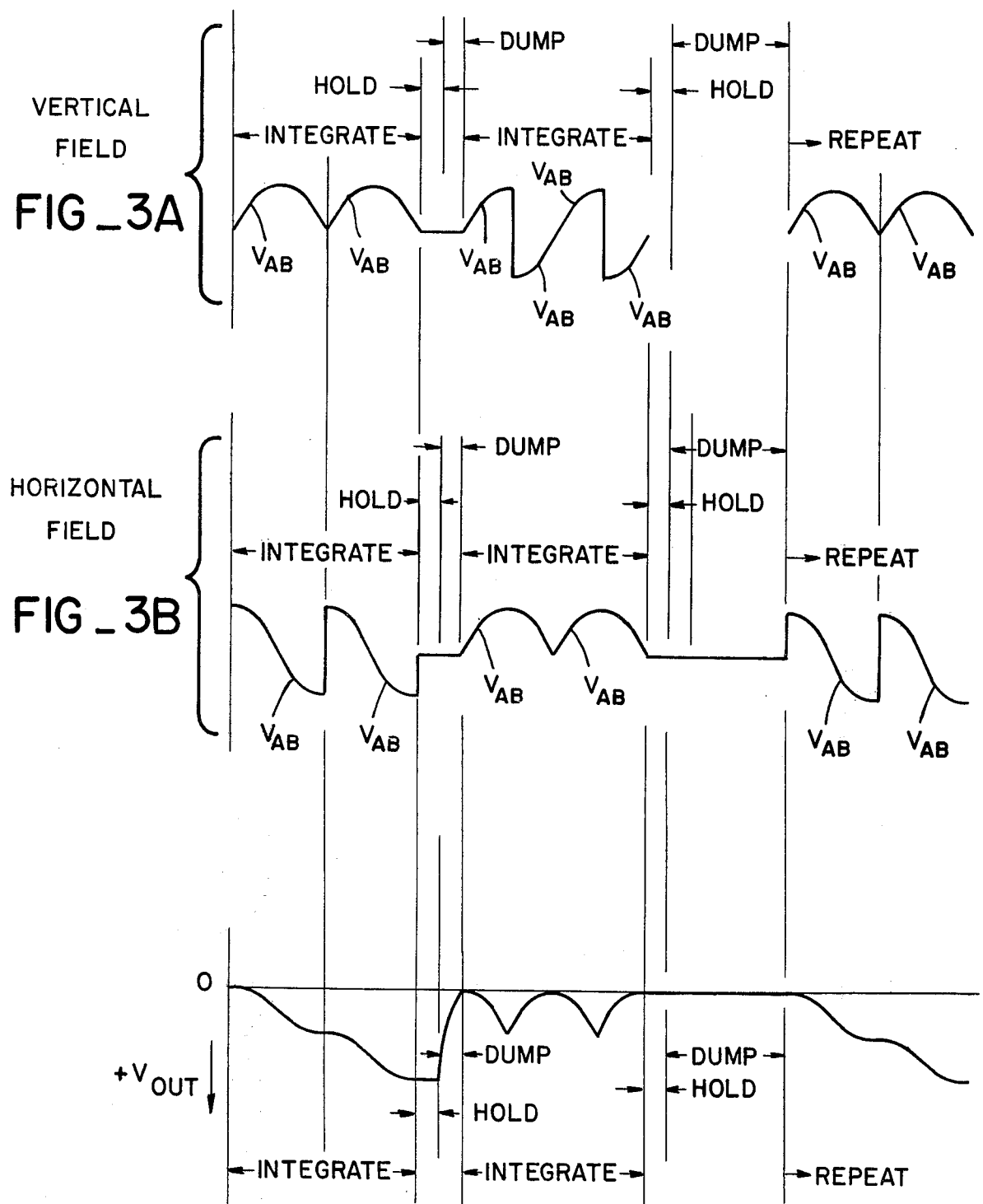
FIG_4
(FOR VERTICAL FIELD OF FIG_3A)

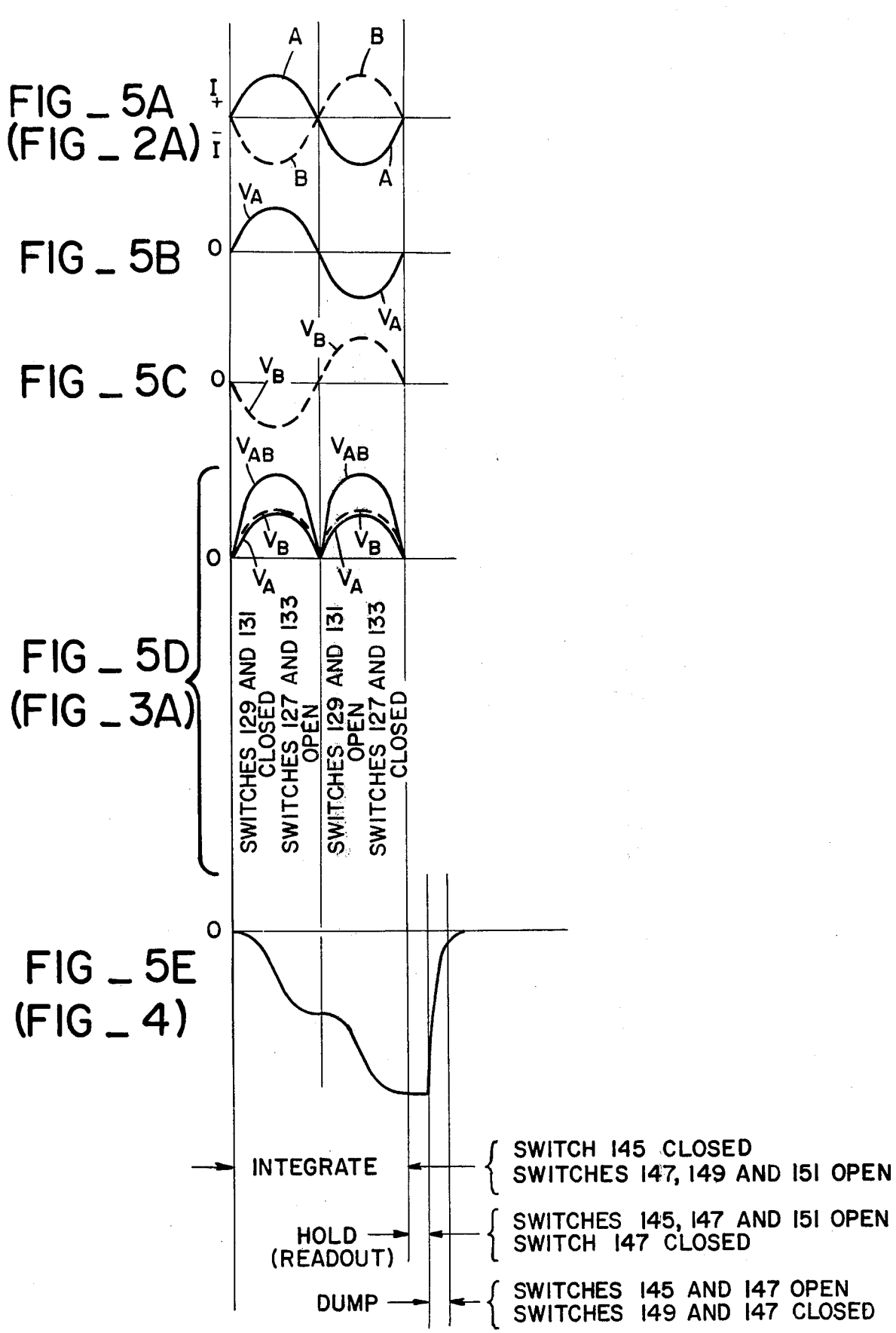

ANALOG SIGNAL PROCESSOR

BACKGROUND OF THE INVENTION

1. Field of the Invention

The present invention relates to an analog processing circuit and more particularly to an analog processing circuit that is capable of processing very low differentially alternating current to a proportional d.c. voltage output.

2. Description of the Prior Art

Prior analog processing circuits have been unable to properly automatically detect and process successively different selected phase components from a very low differential alternating current input signal to a proportional d.c. voltage output suitable for digital processing where the input signal is widely variable in magnitude and phase and contains comparable or higher levels of harmonic signals and other undesirable noise. The present invention overcomes these difficulties by providing a phase discriminating analog signal processor that is capable of processing such signals having a very low frequency and strength into proportional d.c. voltage output signals suitable for digital processing.

SUMMARY OF THE INVENTION

Briefly, the present invention comprises an analog signal processor that is particularly suitable for measuring, integrating and holding a single or a pair of analog signals. The input signal to the analog signal processor may be sinusoidal, of relatively low frequency and of low signal strength and slowly varying phase such as may be obtained from a pair of capacitive plates used in electric field measuring devices. The analog signal processor includes an analog current to voltage convertor, a synchronous rectifier and an integrate and hold circuit. In practice the analog signal processor may be mounted on a rotating shaft and converts the very low differentially alternating current input to a proportional d.c. voltage output. The analog signal processor includes timing and switching circuits to provide the desired information about vertical, horizontal and inclined electric fields.

STATEMENT OF THE OBJECTS OF THE INVENTION

An object of the invention is to provide an analog signal processor that is compact and reliable.

Another object of the present invention is to provide an analog signal processor that is capable of processing successively different choices of phase of very low differential alternating currents to proportional d.c. voltage outputs in the presence of input noise including comparable harmonic signals.

Still another object of the present invention is to provide an analog signal processor that can measure, integrate and hold a single or a pair of analog signals.

Still another object of the present invention is to provide an analog signal processor that may be mounted on a rotating shaft.

A still further object of the present invention is to provide an analog signal processor that may be used in conjunction with an electric field measuring device.

Other objects, advantages and novel features of the invention will become apparent from the following detailed description of the invention when considered in conjunction with the accompanying drawings wherein:

BRIEF DESCRIPTION OF THE DRAWINGS

FIG. 1 is a schematic diagram of the analog signal processor of the present invention;

FIG. 2 is a diagram illustrating the various input signals that may be processed by the analog signal processor of the present invention wherein possible noise, offset levels, signal harmonics are omitted for reasons of clarity;

FIGS. 3A and 3B are wave form and timing diagrams illustrating the operation and output of the synchronous rectifier and the operation of the integrate and hold circuit of FIG. 1 for typical vertical and horizontal field measurements, respectively;

FIG. 4 is a diagram illustrating the integrate, hold and dump operation of the integrate and hold circuit and the output thereof which is part of the analog signal processor FIG. 1; and FIGS. 5A through 5E illustrate the operation of the synchronous rectifier and integrate and hold circuits during one cycle of the vertical field measurement operation.

DESCRIPTION OF THE PREFERRED EMBODIMENT

In U.S. Pat. No. 3,917,996 issued Nov. 4, 1975, by Peter B. Wagner is described an electric field measuring device. More particularly, in this patent application is described an electric field measuring device that is particularly suited for being mounted on the nose boom of an aircraft for periodically measuring the atmospheric electric field intensity and orientation. The device includes a rotating assembly that includes a pair of capacitor plates, analog signal processing equipment, digital processing equipment, a slip ring assembly, orientation light transmitter and receiver assemblies and an information light transmitter. All of these elements are mounted on a rotatable shaft that is driven by an electric motor. The light from the rotating information light transmitter is received by a stationary information light receiver, the output of which is applied to the input of a stationary digital receiver and storage device. Floating d.c. power is transmitted by a brush assembly through the slip ring assembly to the rotating electrical equipment.

In this patent application is a description of the method for generating signals proportional to the atmospheric electric field that is being investigated. This is achieved by positioning the electric field measuring device at different locations within the atmospheric electric field. This is preferably achieved by mounting the electric field measuring device on the nose of an aircraft and periodically measuring the electric field intensity and orientation as the aircarft flies through the atmosphere. The electric field is measured in two of its three vector components, namely the horizontal and vertical components.

The electric field measuring device includes a pair of capacitive plates 17 and 19 that are preferably of metal foil that are mechanically and electrically separated and are rotated at a predetermined rate. By referring to U.S. Pat. No. 3,917,996 and to FIG. 1 of the present invention it can be seen that an analog signal processor 101 includes an analog current to voltage covertor 103 (45) and the synchronous rectifier 105 (47) and an integrate and hold circuit 107 (47) which are the subjects of the present invention. It should be noted that the capacitive plates 17 and 19, the analog current to voltage convertor 103 and the synchronous rectifier 105 and the integrate and hold circuit 107 may be all mounted for rotation.

Typical signals that may be obtained from capacitive plates 17 and 19 are shown in FIGS. 2A through 2E. These signals are of general sinusoidal configuration and will vary in amplitude and phase depending upon the particular field that is being measured. The frequency is selected to be about 400 rpm (6.67 rps) which is determined primarily by the rate of rotation of the rotatable assembly shown in U.S. Pat. No. 3,917,996. The solid line curves of FIGS. 2A through 2E represent the A signal from capacitive plate 17 of FIG. 1 and the dotted line curves of FIGS. 2A through 2E represent the B signal from capacitive plate 19 of FIG. 1. The lower limit of the rate of rotation is determined by the sensitivity of the analog electronics, certain current leakage considerations about the capacitive plates, and by the desired spacial revolution when flown on an aircraft or the like. The maximum limit of the rate of rotation is determined by the wear rate or life expectancy of the mechanical rotating parts as well as by the available band width of the instrumentation.

The typical amplitude of the field induced current from plates 17 and 19 will vary from zero to about $10^{-7}$ amperes. Currents that are $10^{-7}$ amperes are those that may be typically encountered in a thunder storm, for example. If larger currents were introduced it would be required to make circuit modifications that would be obvious to one skilled in the art. It should be noted that capacitive plates 17 and 19 are preferably maintained at zero voltage level. It is to be understood that the analog signal processor 101 of the present invention may be used in virtually all situations where it is desirable to measure, integrate and hold either a single or a pair of analog signals.

In FIG. 1 is illustrated the analog signal processor 101 of the present invention. The analog signal processor 101 includes an analog current to voltage convertor 103 (referred to as 45 in U.S. Pat. No. 3,917,996), a synchronous rectifier 105 (referred to as 47 in U.S. Pat. No. 3,917,996), and an integrate and hold circuit 107 (referred to as 47 in U.S. Pat. No. 3,917,996).

The analog current to voltage convertor 103 includes two identical sections 109 and 111 and therefore only section 109 will be described below in detail. The field signal A of FIGS. 1 and 2 is derived from plate 17 and is applied to the inverting input 113 of operational amplifier 115. The non-inverting input 117 of operational amplifier 115 is connected to ground. Operational amplifier 115 amplifies the difference between the signal applied to the inverting input 113 and the signal applied to the non-inverting input 117. The operational amplifier 115 has an extremely high gain, a factor of about $10^6$, to provide sufficient amplification for low level incoming signals. The output of operational amplifier 115 is applied to a plurality of electronic switches 119, 121, and 123 and through a feedback network including resistor 125. This functions as a negative feedback to the inverting input 113 and therefore reduces the voltage level between plate 17 (A signal) and the ground potential. This is necessary to provide for the high gain of operational amplifier 115. Side by side diodes 116 and 118, having high resistance, are employed to protect operational amplifier 115 by shunting abnormally high currents to ground.

Switches 119, 121 and 123 function to control the overall gain of the circuit and are controlled by an automatic gain control circuit 124 when the magnitude of the analog output signal $V_{out}$ becomes too high or too low. Many different automatic gain control circuits could be used and therefore the details of circuit 124 will not be described herein. The operation of switches 119, 121 and 123 will be described in detail as follows. When switch 119 is closed, and switches 121 and 123 are open, then the output voltage $V_A = IR = V_{FB}$ where R is the resistance of resistor 125 and I is the current from plate 17. However, when switch 121 is closed, and switches 119 and 123 are open, then $V_A = (R_1+R_2/R_2) IR$ and therefore $V_A > V_{FB}$. By selecting different resistances for $R_3$ and $R_4$ then $V_A >> V_{FB}$ by closing switch 123 and opening switches 119 and 121. From the foregoing it can be seen that the output voltage $V_{out}$ may be maintained at an acceptable level even though the value of the charge A on plate 17 varies over a wide range. In situations where it is necessary to employ a smaller bandwidth it will be desirable to shunt resistor 125 with a capacitor 126 shown in dotted lines.

In FIG. 1 is shown synchronous rectifier 105 which includes four electronic switches 127, 129, 131 and 133. Swtich 127 connects the $V_A$ signal to the negative input of differential voltage amplifier 135 through resistor 137 and switch 131 connects the $V_B$ signal to the negative input of differential voltage amplifier 135 through resistor 137. Switch 133 connects the $V_B$ signal to the positive input of differential voltage amplifier 135 through resistor 139 and switch 129 connects the $V_A$ signal to the positive input of differential voltage amplifier 135 through resistor 139. These switches operate in pairs and have alternative action. That is, when switches 127 and 133 are closed then switches 129 and 131 are open and conversely when switches 127 and 133 are open then switches 129 and 131 are closed. Resistor 140 is placed between the positive input and ground. Differential voltage amplifier 135 is made to have unity gain by selecting the proper values for resistors 137, 139, 140 and 141, which is in the feedback loop. Referring to FIG. 2A, for example, it can be seen that differential voltage amplifier will invert and add the $V_A$ and $V_B$ signals so that the resulting signal will be the sum of $V_B - V_A$ when the switches are in the position shown. When the four switches are reversed then the output from amplifier 135 will be $V_A = V_B$. It should be noted that the switching times and sequences may be varied in accordance with the particular fields being measured and the particular information desired. One particular switching sequence, for vertical fields, is shown in FIG. 5. Other switching sequences will be obvious to one skilled in the art from the following discussion of FIGS. 3, 4 and 5. Many different types of switch control circuits 156 could be used and therefore the details of circuit 156 will not be described herein. However, it should be noted that the switching by switch control circuit 156 must be in accordance with the above description of operation and in accordance with the various timing diagrams.

In FIG. 1 is shown the integrate and hold circuit 107 which includes an amplifier 143, an integrate switch 145, a hold switch 147, and a pair of dump switches 149 and 151 which are operated as a pair. The dump switches 149 and 151 function to short integrating capacitor 153 through resistor 155 to ground when it is desired to discharge the capacitor 153 as hereinafter explained.

During that period of time that it is desired to integrate the incoming signal, then switch 145 is closed, switches 149 and 151 are open and switch 147 is open. Therefore capacitor 153 will become charged to d.c. level that corresponds to the integration of the signal $V_{AB}$ shown in FIG. 3A which represents the measurement of a vertical field, for example. In FIG. 4 is illustrated the signal $V_{out}$ that will appear at the output of amplifier 143 during the first two cycles of FIG. 3A. From FIG. 4 it can be seen that after the integration time, then switch 145 is opened, switch 147 is closed and switches 149 and 151 are open. This is referred to as the hold period. Switch 147 is employed to assure that any extraneous charges will be shunted to ground and will not be applied to integrating capacitor 153 which would provide erroneous readings. Effectively the amplifier continues to integrate with time the grounded (zero) input and therefore no change in $V_{out}$ results. During this hold period the signal $V_{out}$ will be read and recorded by external circuitry, not shown. After a suitable hold period switches 149 and 151 are closed thereby discharging or dumping integrating capacitor 153 through resistor 155 to ground. This is referred to as the dump period. After the dump period, the cycle is then repeated.

It should be noted that FIGS. 3A (for the first integrate, hold and dump cycle), FIG. 4 (for the first integrate, hold and dump cycle) and FIG. 5 are to taken together and show the complete switching sequence, timing and operation of synchronous rectifier 105 and integrate and hold circuit 107. This sequence is considered sufficient to clearly demonstrate the operation of the system. To completely describe all possible switching modes and combinations would unduly complicate the description and would be obvious to one skilled in the art. Resistor 155 is used to somewhat limit the discharge rate of the capacitor through switches 149 and 151.

Switches 145, 147, 149 and 151 are controlled by switch control circuit 157. Many different types of switch control circuits 157 could be used and therefore the details of circuit 157 will not be described herein. However, it should be noted that the switching by switch control circuit 157 must be in accordance with the above description of operation and in accordance with the various timing diagrams. With the low frequencies involved solenoid mechanical switches could be employed, however, it is preferable to employ electronic switching.

What is claimed is:
1. A analog signal processor comprising:
 a. an analog current to voltage convertor;
 b. a synchronous rectifier;
 c. an integrate and hold circuit;
 d. said analog current to voltage convertor includes first and second operational amplifiers;
 e. first current means for producing a first alternating current signal and second current means for producing a second alternating current signal that is 180° out of phase with respect to said first alternating current signal;
 f. said first current means being connected to the input of said first operational amplifier;
 g. said second current means being connected to the input of said second operational amplifier;
 h. the output of said first operational amplifier and the output of said second operational amplifier being connected to the input of said synchronous rectifier;
 i. means for controlling said synchronous rectifier whereby the negative portion of the output siganl from said second operation amplifier is inverted and added to the positive portion of the output signal from said first operational amplifier and the negative portion of the output signal from said first operational amplifier is inverted and added to the positive portion of the output signal from said second operational amplifier;
 j. the output of said synchronous rectifier being connected to the input of said integrate and hold circuit; whereby
 k. the output of said integrate and hold circuit indicates a d.c. voltage output that is proportional to the output of said synchronous rectifier.
2. The analog signal processor of claim 1 including:
 a. said integrate and hold circuit including an amplifier; and
 b. an integrate switch connected between the output of said synchronous rectifier and the input of said amplifier.
3. The analog signal processor of claim 2 including:
 a. a hold switch connected between said input of said amplifier and ground.
4. The analog signal processor of claim 3 including:
 a. an integrating capacitor connected between the input and the output of said amplifier.
5. The analog signal processor of claim 4 including:
 a. first and second dump switches connected in series with each other and in parallel with said integrating capacitor; and
 b. a resistor connected between said first and second dump switches and ground.
6. The analog signal processor of claim 5 including:
 a. switch control means for closing said integrate switch and opening said hold and first and second dump switches during the 360° time period of said first and second alternating current signals, then closing said hold switch and opening said integrate and first and second dump switch and then opening said integrate and hold switch and closing said first and second dump switches.

* * * * *